(12) United States Patent
Coscarella

(10) Patent No.: US 10,051,756 B2
(45) Date of Patent: Aug. 14, 2018

(54) SURROUND FOR ELECTRICAL BOXES

(71) Applicant: Gabe Coscarella, Edmonton (CA)

(72) Inventor: Gabe Coscarella, Edmonton (CA)

(*) Notice: Subject to any disclaimer, the term of this patent is extended or adjusted under 35 U.S.C. 154(b) by 0 days.

(21) Appl. No.: 15/882,840

(22) Filed: Jan. 29, 2018

(65) Prior Publication Data

US 2018/0153053 A1 May 31, 2018

Related U.S. Application Data

(62) Division of application No. 13/947,927, filed on Jul. 22, 2013, now Pat. No. 9,883,602.

(30) Foreign Application Priority Data

Jul. 20, 2012 (CA) .................................... 2783650

(51) Int. Cl.
H05K 5/06 (2006.01)
H02G 3/08 (2006.01)
H02G 3/14 (2006.01)

(52) U.S. Cl.
CPC ............. *H05K 5/069* (2013.01); *H02G 3/088* (2013.01); *H02G 3/14* (2013.01); *Y10T 29/49826* (2015.01); *Y10T 428/13* (2015.01); *Y10T 428/24281* (2015.01)

(58) Field of Classification Search
CPC ............ H02G 3/10; H02G 3/12; H02G 3/121; H02G 3/123; H02G 3/14; H02G 3/18; H02G 3/088; H05K 5/069
USPC ........... 52/61, 63, 220.8; 174/57, 58, 66, 67; 220/3.2, 3.3, 3.5, 3.6, 241, 242
See application file for complete search history.

(56) References Cited

U.S. PATENT DOCUMENTS

| 1,249,892 A | 12/1917 | Bropson |
| 2,407,023 A | 9/1946 | Lockwood |
| 2,985,465 A | 5/1961 | Church |
| 3,787,061 A | 1/1974 | Yoakum |
| 3,809,350 A | 5/1974 | Lane |
| 3,913,928 A | 10/1975 | Yamaguchi |
| 4,087,624 A * | 5/1978 | Hitchcock ............... A62C 3/16 169/48 |
| 4,162,347 A | 7/1979 | Montgomery |
| 4,265,058 A | 5/1981 | Logsdon |
| 4,293,138 A | 10/1981 | Swantee |
| 4,296,870 A * | 10/1981 | Balkwill ............... H02G 3/088 174/57 |
| 4,350,351 A | 9/1982 | Martin |
| 4,385,777 A | 5/1983 | Logsdon |
| 4,386,488 A | 6/1983 | Gibbs |
| 4,482,161 A | 11/1984 | Izzi, Sr. |

(Continued)

FOREIGN PATENT DOCUMENTS

| DE | 41 31 637 A1 | 4/1992 |
| DE | 298 00 679 U1 | 7/1998 |

(Continued)

*Primary Examiner* — Brian E Glessner
*Assistant Examiner* — Adam G Barlow
(74) *Attorney, Agent, or Firm* — Christensen O'Connor Johnson Kindness PLLC

(57) ABSTRACT

A surround for an electrical box has a sheet of flexible, weatherproof material having a skirt portion, and a flange extending at least outward relative to the skirt portion, the flange defining an opening within the skirt portion sized to provide access to an inner cavity of the electrical box.

9 Claims, 5 Drawing Sheets

(56) References Cited

U.S. PATENT DOCUMENTS

| | | |
|---|---|---|
| 4,526,407 A | 7/1985 | Kifer |
| 4,548,853 A | 10/1985 | Bryan |
| 4,563,847 A | 1/1986 | Hasty |
| 4,794,207 A | 12/1988 | Norberg et al. |
| 4,903,997 A | 2/1990 | Kifer |
| 4,905,940 A | 3/1990 | Luka |
| 4,927,039 A * | 5/1990 | McNab ............... H02G 3/125 174/57 |
| 4,952,754 A | 8/1990 | Rye |
| 5,133,165 A * | 7/1992 | Wimberly ............. E04F 19/02 52/220.8 |
| 5,237,789 A | 8/1993 | Thaler |
| 5,248,154 A | 9/1993 | Westhoff et al. |
| 5,347,776 A | 9/1994 | Skoff |
| 5,501,472 A | 3/1996 | Brancher et al. |
| 5,557,078 A | 9/1996 | Holwerda |
| 5,860,256 A | 1/1999 | Humber |
| 5,944,361 A | 8/1999 | Bravo |
| 6,161,589 A | 12/2000 | Bolotte et al. |
| 6,185,885 B1 | 2/2001 | Thaler |
| 6,315,849 B1 | 11/2001 | Ross |
| 6,395,984 B1 | 5/2002 | Gilleran |
| 6,417,447 B1 * | 7/2002 | Bosse, Jr. ............. H02G 3/10 174/505 |
| 6,494,463 B1 | 12/2002 | Rank |
| 6,543,186 B2 | 4/2003 | Gilleran |
| 6,596,938 B2 | 7/2003 | Gilleran |
| 6,649,835 B2 | 11/2003 | Gilleran |
| 6,860,070 B2 | 3/2005 | Gilleran |
| 6,862,852 B1 | 3/2005 | Beele |
| 7,176,377 B1 * | 2/2007 | Gretz ................. H02G 3/121 174/481 |
| 7,192,219 B2 | 3/2007 | Graziosi |
| 7,319,192 B1 * | 1/2008 | Gretz et al. ........... H02G 3/123 174/50 |
| 7,435,900 B1 * | 10/2008 | Gretz ................. H01R 25/006 174/480 |
| 7,568,314 B2 | 8/2009 | Collins |
| 7,637,385 B2 * | 12/2009 | Wegner et al. ........ H02G 3/086 174/57 |
| 7,645,937 B2 * | 1/2010 | Bhosale ............... H02G 3/123 174/135 |
| 7,674,974 B1 * | 3/2010 | Shotey et al. ......... H02G 3/088 174/480 |
| 7,789,257 B2 * | 9/2010 | Davis ................. H02G 3/123 174/58 |
| 7,802,798 B2 | 9/2010 | Beele |
| 7,918,066 B1 | 4/2011 | Bauer |
| 8,079,599 B2 | 12/2011 | Meyers |
| 8,156,700 B2 | 4/2012 | Umlor |
| 8,933,331 B1 * | 1/2015 | Gretz ................. E04B 2/00 174/50 |
| 2001/0052564 A1 | 12/2001 | Karlinger |
| 2003/0019163 A1 | 1/2003 | Dittel |
| 2003/0037942 A1 | 2/2003 | Haselby et al. |
| 2004/0045233 A1 | 3/2004 | Beele |
| 2005/0055889 A1 | 3/2005 | Thaler |
| 2007/0245894 A1 | 10/2007 | Poulis |
| 2008/0085336 A1 | 4/2008 | Mayle |
| 2008/0124506 A1 | 5/2008 | Boge et al. |
| 2008/0157518 A1 | 7/2008 | Cecilio |
| 2009/0152820 A1 | 6/2009 | Meyers |
| 2010/0059941 A1 | 3/2010 | Beele |
| 2010/0263311 A1 | 10/2010 | Ryden |
| 2011/0056743 A1 * | 3/2011 | Solan ................. H02G 3/123 174/502 |
| 2013/0234404 A1 | 9/2013 | Coscarella |
| 2014/0202758 A1 * | 7/2014 | Lolachi .............. H02G 3/123 174/481 |

FOREIGN PATENT DOCUMENTS

| | | |
|---|---|---|
| DE | 20 2012 101 447 U1 | 7/2012 |
| DE | 20 2013 100 908 U1 | 6/2013 |
| EP | 0 161 557 A2 | 11/1985 |
| EP | 2 063 163 A1 | 5/2009 |

* cited by examiner

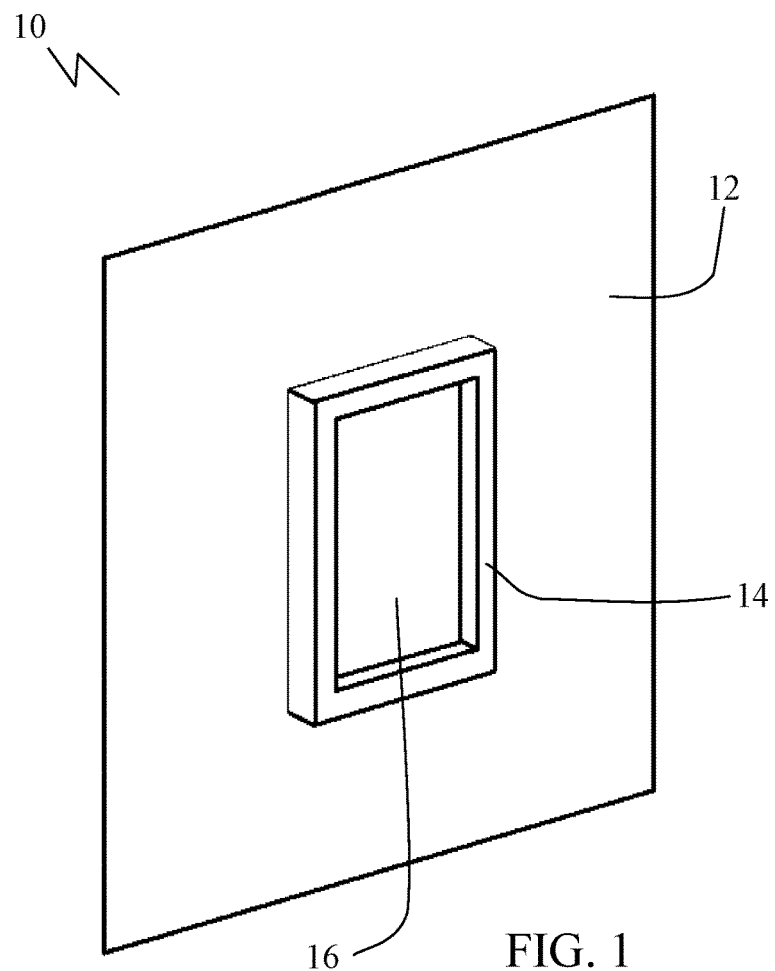
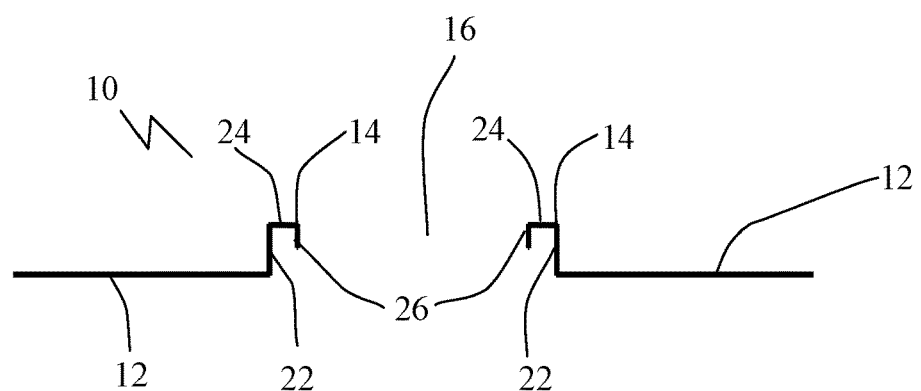

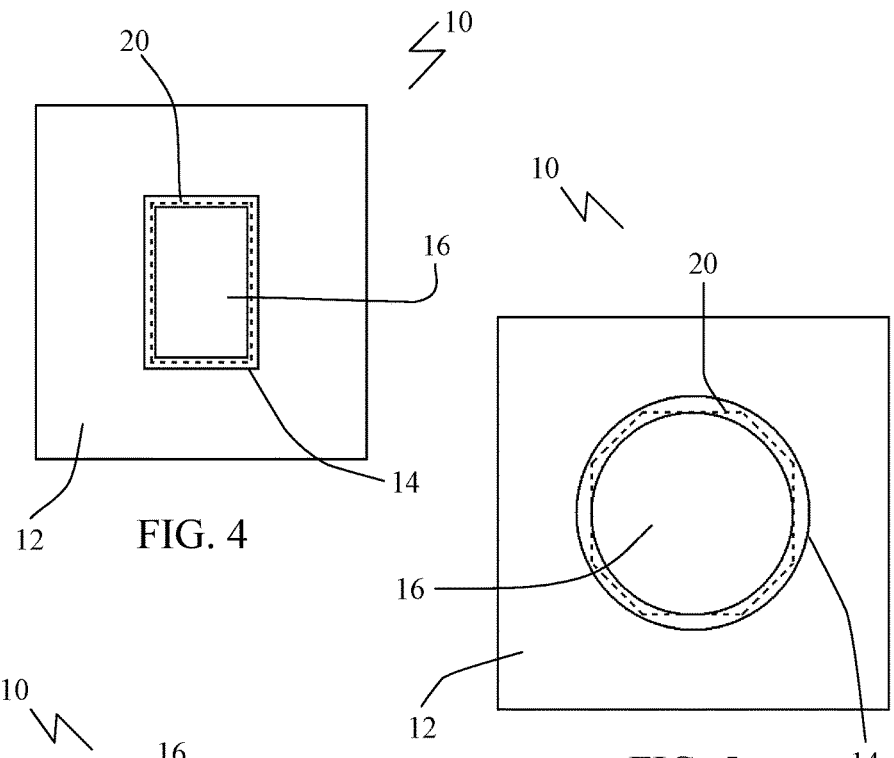
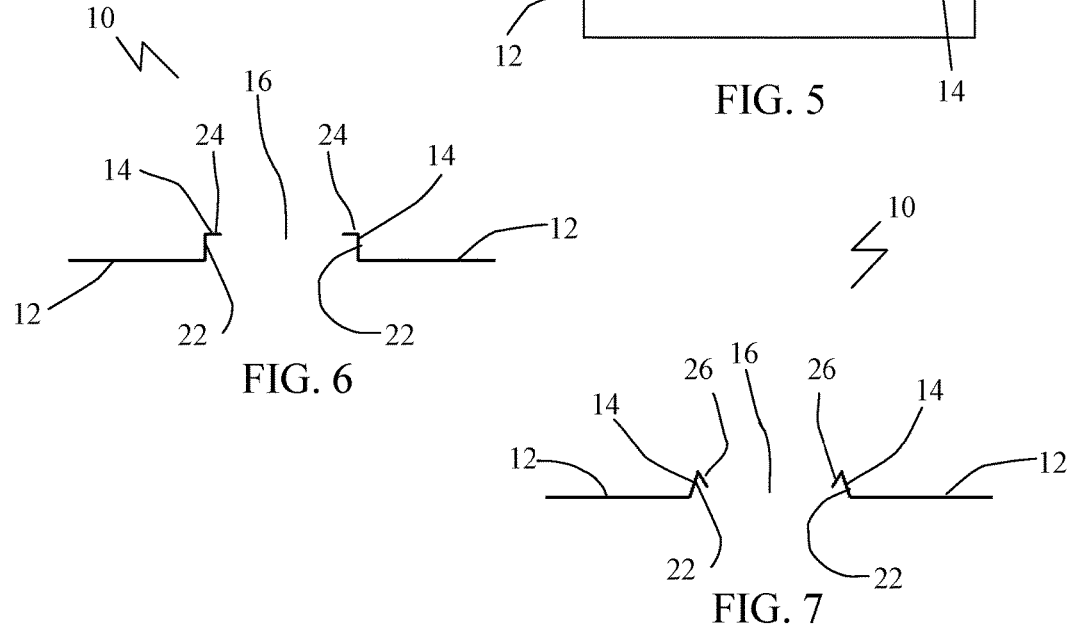

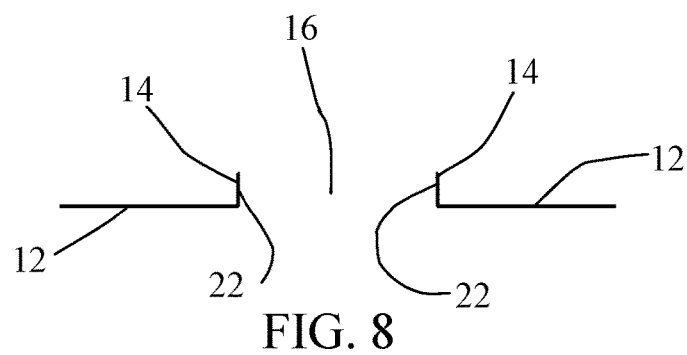
FIG. 8
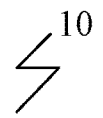
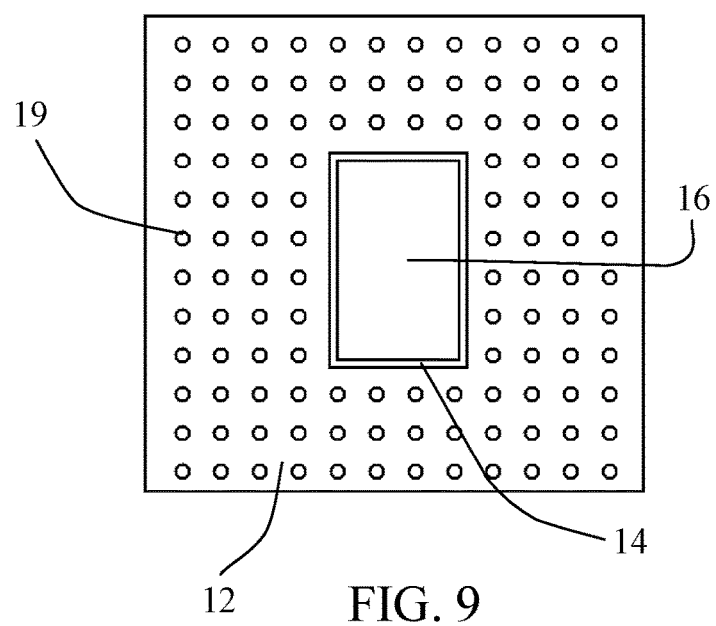
FIG. 9

SURROUND FOR ELECTRICAL BOXES

CROSS-REFERENCE TO RELATED APPLICATION

This application is a division of U.S. patent application Ser. No. 13/947,927, filed Jul. 22, 2013, the disclosure of which is incorporated herein by reference.

FIELD

This relates to a surround for electrical boxes, in particular, a surround made from weatherproofing material that weatherproofs around an electrical box.

BACKGROUND

When weatherproofing a building, it is necessary to seal all possible openings for air and water. This is generally done using appropriate material to wrap around the building. However, holes made in walls for electrical boxes are potential openings for air and water that must also be closed.

SUMMARY

There is provided a surround for an electrical box, the surround comprising a sheet of flexible, weatherproof material having a skirt portion, and a flange that extends at least outward relative to the skirt portion. The flange defines an opening within the skirt portion sized to provide access to an inner cavity of the electrical box.

According to an aspect, the flange may further extend inward toward the opening such that a top edge of the electrical box is engaged by the flange.

According to an aspect, the opening for the electrical box may be rectangular, circular, polygonal or octagonal.

According to an aspect, the flange may double back after extending inward. The flange may have one of a U-shaped cross-section, a V-shaped cross-section or an L-shaped cross-section.

According to an aspect, the height of the flange above the skirt portion may be equivalent to the distance the electrical box extends outward relative to a structural element of a building.

According to an aspect, the flange may connect to a back portion that is spaced behind the skirt portion relative to the flange, such that, when installed, the flange and the back portion line an inner surface of the electrical box.

According to another aspect, there is provided a method of weatherproofing around an electrical box that is attached to a structural element of a building. The electrical box has an internal cavity and a peripheral edge around the internal cavity. The peripheral edge is spaced outward relative to the structural element of a building by a first distance. The method comprises the steps of: providing a surround as described above; overlaying the surround over the electrical box such that the flange engages an outer edge of the electrical box and the opening provides access to the internal cavity; and attaching the skirt portion to a layer of weatherproofing material installed on the structural element of the building.

According to another aspect, there is provided a liner for a utility box, comprising a sheet of flexible, weatherproof material having a box liner portion and a skirt portion that surrounds the liner portion and defines a plane. The box liner portion comprises a first enclosure that extends above the plane of the skirt portion and a second enclosure that is connected to an inner edge of the first enclosure and extends below the plane of the skirt portion. The first enclosure is sized to receive and surround an outer edge of the utility box when installed and the second enclosure is sized and shaped to fit within and line an inner surface of the utility box when installed.

According to an aspect, the utility box may be an electrical box.

According to an aspect, the upper edge of the utility box may be one of rectangular, circular, and polygonal.

According to an aspect, the first enclosure may have one of a U-shaped cross-section, a V-shaped cross-section, and an L-shaped cross-section.

According to an aspect, the height of the first enclosure above the plane of the skirt portion may be equivalent to the distance the electrical box extends outward relative to a structural element of a building.

Other aspects will be apparent from the description and drawings.

BRIEF DESCRIPTION OF THE DRAWINGS

These and other features will become more apparent from the following description in which reference is made to the appended drawings, the drawings being for the purpose of illustration only and not intended to be in any way limiting, wherein:

FIG. 1 is a perspective view of a surround for an electrical box;

FIG. 2 is a top plan view of the surround;

FIG. 4 is a front plan view of the surround;

FIG. 5 is a front plan view of a circular surround;

FIGS. 6-8 are top plan views of alternative surrounds;

FIG. 9 is a front plan view of the surround with a textured surface;

DETAILED DESCRIPTION

Figure 3:
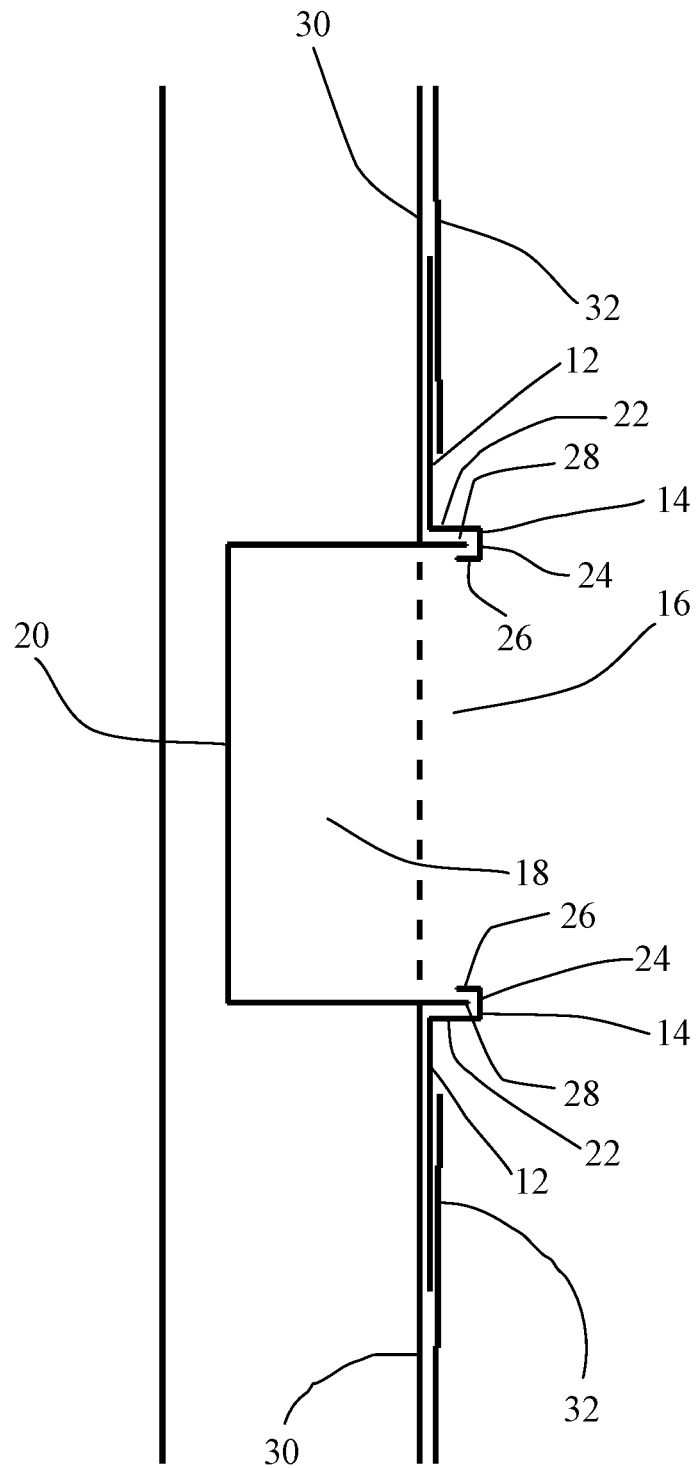
FIG. 3 is a side elevation view of the surround installed on a structural element.

Embodiments of a surround for a utility box, such as an electrical box, generally identified by reference numeral 10, will now be described with reference to FIGS. 1-11.

Referring to FIG. 1, surround 10 is made from a sheet of flexible, weatherproof material and has a skirt portion 12 and a flange 14. Skirt portion 12 and flange 14 may be made from different materials, although it is preferred that each is made from the same material to reduce the costs and complexity of manufacturing. Skirt portion 12 is preferably flat as depicted to help properly weatherproof a building, although, referring to FIG. 9, it may be textured, such as with ribs or dots 19, or in other ways, depending on the preferences of the user and the intended use. Dots 19 may create bumps which are preferably on the back side of skirt portion 12 and provide some air flow. Referring to FIG. 1, skirt 12 and flange 14 may be made using different manufacturing techniques. Preferably, skirt 12 and flange 14 are made from a flexible plastic using known techniques, such as vacuum forming, injection molding, etc. Other weatherproof materials and other techniques, such as the use of welding, adhesives, etc., that result in a weatherproof product, may also be used. By "weatherproof," it is generally understood that the material is at least impermeable to water or other liquids. Weatherproof may also refer to the ability to seal against airflow.

Referring to FIG. 3, flange 14 defines an opening 16 within skirt portion 12 that is sized to provide access to an inner cavity 18 of an electrical box 20. Referring to FIGS. 4 and 5, opening 16 may take various shapes. Most electrical boxes are rectangular or octagonal, and opening 16 may mimic these shapes. Other polygonal or rounded shapes may also be used. Opening 16 may also approximate these shapes, such that a circular shape (as shown in FIG. 5) may be used to enclose an octagonal electrical box 20. As surround 10 is preferably made from flexible and somewhat resilient material, flange 14 may be able to engage electrical box 20 in a closely fit arrangement, or a loose arrangement.

Referring to FIG. 2, flange 14 preferably has a U-shaped cross-section with three sections: a first section 22 that extends outward relative to skirt portion 12, a second section 24 that extends inward toward opening 16, and a third section 26 that doubles back on first section 22. This shape is used to engage the top of the peripheral edge 28 of electrical box 20. Referring to FIGS. 6-8, it will be understood that flange 14 may take different forms. For example, referring to FIG. 6, flange 14 may only be made up of first and second sections 22 and 24 in an L-shaped configuration, without a section that doubles back and extends into the interior of electrical box 20. Alternatively, referring to FIG. 7, flange 14 may be made up of first and third sections 22 and 26 in a V-shaped cross-section. In the embodiments shown in FIGS. 6 and 7, flange 14 may be considered an edge engaging profile that engages the top surface of electrical box 20 around peripheral edge 28. In a further embodiment, referring to FIG. 8, flange 14 may be made up of first section 22 only. It will also be understood that flange 14 may be combinations of different profiles, such as to accommodate the flanges used to attach face plates, as one progresses around flange 14. It will also be understood that, while the drawings show the transitions between the various sections being corners, that these sections and transitions could be curved as well and may be a continuous curve such that the sections are not distinct from each other.

Flange 14 may be designed to fit snugly, elastically or loosely around electrical box 20. For example, the size of first portion 22 in FIG. 6 may be slightly larger than electrical box 20 with third portion 26 slightly smaller than electrical box 20, such that surround 10 fits loosely on electrical box 20. In another example, the size of first portion 22 in FIG. 8 may be very close to, or slightly smaller than, the size of electrical box 20, such that first portion 22 fits tightly, or even elastically, around the outside of electrical box 20. It will be apparent that other designs may also be used based on similar principles. However, if a snug or elastic design is used, care must be taken as electrical boxes often have sharp edges or tabs on the outside that may obstruct or damage surround 10.

Figures 10, 11:
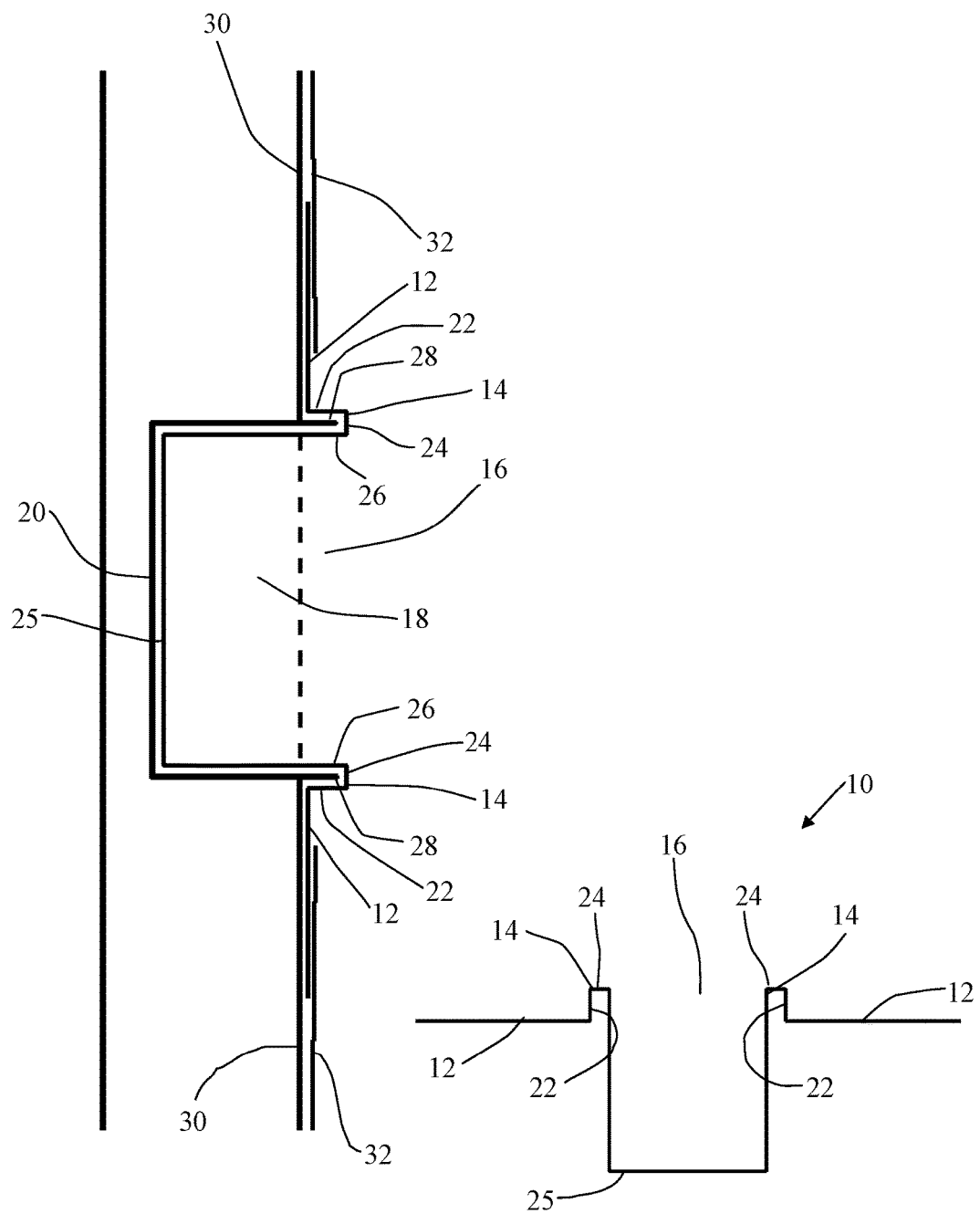
FIG. 10 is a side elevation view in section of an alternative surround installed in a wall.
FIG. 11 is a side elevation view in section of an alternative surround.

Referring to FIGS. 10 and 11, flange 14 may also extend back into electrical box 20, and may include a back portion 25 that covers the back of electrical box 20. In this design, flange 14 forms a first enclosure that receives a top or front edge of electrical box 20, and third portion 26 is connected to back portion 25 to form a second enclosure that is sized to fit within and line an inner surface of electrical box 20. Preferably, flange 25, third portion 26 and back portion 25 are sized to relatively close tolerances to ensure a tight fit.

Referring to FIGS. 3-5, surround 10 is preferably designed to provide a relatively close fit around peripheral edge 28 of electrical box 20. As can be seen in FIG. 3, the height of flange 14 above skirt portion 12 is roughly equivalent to the distance electrical box 20 extends outward relative to a structural element 30 of a building.

When installing an electrical box, it is necessary to make a hole in the wall, roof, etc., of the building, which is often made from wood but may be made from other materials as well. The hole must be slightly larger than the electrical box, which results in a gap between the electrical box and the structural element. When made in an exterior part of the building, building codes may require this gap to be weatherproofed along with the rest of the building to prevent moisture and the like from entering the building. Given the sizes being dealt with, this can be a difficult process and often involves taping the weatherproofing material installed on the building, such as a building wrap material similar to TYVEK®, produced by DuPont, to the electrical box.

Referring to FIG. 3, the gap between electrical box 20 and structural element 30 may be closed using the presently described surround 10. As can be seen, surround 10 is placed over electrical box 20 such that skirt portion 12 extends outward from electrical box 20 and overlaps structural element 30, while flange 14 extends along the side of electrical box 20, and in the case of the embodiments shown in FIGS. 6 and 7, overlaps peripheral edge 28 of electrical box 20 as well. In any event, cavity 18 of electrical box 20 is accessible through opening 16 of surround 10. With respect to the embodiments in FIGS. 6 and 7, once the cover plate (not shown) is installed onto electrical box 20, flange 14 will be held in place by the same pin connection. Flange 14 may have preset holes for the screws of the cover plate, or the screws may make the necessary holes in flange 14 as they are installed. As can be seen, skirt portion 12 and flange 14 provide a weatherproofing barrier to cover the transition from structural element 30 to electrical box 20. Skirt portion 12 is sized to provide a convenient area that can be attached to the building wrap 32, such as by taping. To secure surround 10 in place, it may be stapled in place or otherwise attached, as long as any holes are then covered by the weatherproofing material 32. As shown, skirt portion 12 is below building wrap 32, but it may also be layered above building wrap 32.

Surround 10 may also used for other types of boxes for utilities other than electrical that may benefit from a liner or surround. Preferably, the box will be inset relative to a wall or other structure of a building and with an upper or outer edge that extends out from the wall. For example, boxes may be used to connect communication lines.

In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be one and only one of the elements.

The following claims are to be understood to include what is specifically illustrated and described above, what is conceptually equivalent, and what can be obviously substituted. The scope of the claims should not be limited by the preferred embodiments set forth in the examples, but should be given the broadest interpretation consistent with the description as a whole.

The embodiments of the invention in which an exclusive property or privilege is claimed are defined as follows:

1. A method of weatherproofing around a utility box that is attached to a structural element of a building, the utility box having an internal cavity and a peripheral edge around the internal cavity, the peripheral edge being spaced outward relative to the structural element of a building by a first distance, the method comprising the steps of:

provide a surround comprising a sheet of non-rigid, flexible, weatherproof material having a skirt portion and a flange, the skirt defining a continuous weatherproof surface between the flange and an outer perimeter of the skirt portion, the flange defining an opening within the skirt portion, the flange extending outward relative to the skirt portion at least a second distance that is equal to the first distance, the flange further extending inward toward the opening;

overlaying the surround over the utility box such that the flange engages an outer edge of the utility box and the opening provides access to the internal cavity, the engagement between the flange and the outer edge of the utility box causing the sheet to change shape or size to accommodate the size or shape of the utility box; and attaching the skirt portion to a layer of weatherproofing material installed on the structural element of the building.

2. The method of claim 1, wherein the flange overlies a top edge of the utility box.

3. The method of claim 1, wherein the opening for the utility box is one of rectangular, circular, and polygonal.

4. The method of claim 1, wherein the flange doubles back within the opening after extending inward toward the opening, the flange being sized to extend into the inner cavity of the utility box.

5. The method of claim 1, wherein the flange has one of a U-shaped cross-section, a V-shaped cross-section, and an L-shaped cross-section.

6. The method of claim 1, wherein the flange connects to a back portion that is spaced behind the skirt portion relative to the flange, such that, when installed, the flange and the back portion line an inner surface of the utility box.

7. The method of claim 1, wherein the flange has a first face that extends perpendicularly outward from the skirt portion to a top end point above the skirt portion, the first face having an inner perimeter that is greater than an outer perimeter of the utility box, and a second face that extends inward toward the opening from the top end of the first face, the second face being parallel to and spaced from the skirt portion such that in use, the second face overlies the top edge of the utility box and is spaced outward from the inner cavity of the utility box relative to the skirt portion.

8. The method of claim 7, wherein the flange further comprises an inner face that extends downward from the parallel face, the inner face being parallel to and spaced from the perpendicular face, such that the perpendicular face, the parallel face, and the inner face define a receptacle that receives and encloses the top edge of the utility box.

9. The method of claim 7, wherein the flange connects to a back portion that is spaced behind the skirt portion relative to the flange, the flange and the back portion being sized and shaped to line an inner surface of the utility box.

\* \* \* \* \*